US012757469B2

(12) United States Patent
Lin et al.

(10) Patent No.: US 12,757,469 B2
(45) Date of Patent: Oct. 6, 2026

(54) WRAP AROUND BACKSIDE SOURCE/DRAIN CONTACT

(71) Applicant: International Business Machines Corporation, Armonk, NY (US)

(72) Inventors: Anna Lin, Cranbury, NJ (US); Gopal Sankar Kenath, Troy, NY (US); Tao Li, Slingerlands, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 409 days.

(21) Appl. No.: 18/519,222

(22) Filed: Nov. 27, 2023

(65) Prior Publication Data

US 2025/0176246 A1 May 29, 2025

(51) Int. Cl.

| | |
|---|---|
| ***H10D 64/23*** | (2025.01) |
| ***H10D 30/01*** | (2025.01) |
| ***H10D 62/10*** | (2025.01) |
| ***H10D 84/01*** | (2026.01) |
| ***H10D 84/03*** | (2025.01) |
| ***H10D 84/83*** | (2025.01) |

(52) U.S. Cl.

CPC ....... *H10D 64/254* (2025.01); *H10D 30/0198* (2025.01); *H10D 62/121* (2025.01); *H10D 64/258* (2025.01); *H10D 84/0149* (2025.01); *H10D 84/0151* (2025.01); *H10D 84/038* (2025.01); *H10D 84/8312* (2025.01); *H10D 84/832* (2025.01)

(58) Field of Classification Search

CPC ............. H10D 64/254; H10D 30/0198; H10D 62/121; H10D 64/258; H10D 84/0149; H10D 84/0151; H10D 84/038; H10D 84/8312; H10D 84/832; H10D 30/43; H10D 30/6735; H10D 30/6757; H10D 84/83; H10D 84/85; H10D 30/014; H10D 62/151; H01L 29/4175; H01L 29/0673; H01L 29/41775; H01L 29/42392; H01L 29/775; H01L 29/78696; H01L 21/823475; H01L 27/088

See application file for complete search history.

(56) References Cited

U.S. PATENT DOCUMENTS 9,847,390 B1 12/2017 Xie et al.
9,960,272 B1 * 5/2018 Bao ...................... H10D 64/252
(Continued)

FOREIGN PATENT DOCUMENTS

EP 4199114 A1 6/2023

*Primary Examiner* — Earl N Taylor
(74) *Attorney, Agent, or Firm* — Cantor Colburn LLP; Samuel Waldbaum

(57) ABSTRACT

Embodiments of the present invention are directed to processing methods and resulting structures for providing wraparound backside source/drain contacts through a wafer backside. In a non-limiting embodiment, a first field effect transistor and a second filed effect transistor are formed. The first field effect transistor includes a first source or drain (S/D) region, a second S/D region, and a backside contact. The backside contact includes a lower portion and a wraparound portion wrapping around a lower portion of the second S/D region. The second field effect transistor includes a frontside contact on a S/D region and a backside sacrificial region below the S/D region.

18 Claims, 11 Drawing Sheets

(56) References Cited

U.S. PATENT DOCUMENTS

| | | | | |
|---|---|---|---|---|
| 10,236,218 | B1 | 3/2019 | Xie et al. | |
| 10,559,656 | B2 | 2/2020 | Bourjot et al. | |
| 10,804,398 | B2 | 10/2020 | Frougier et al. | |
| 10,903,365 | B2 * | 1/2021 | Cheng | H10D 30/6211 |
| 10,944,009 | B2 | 3/2021 | Wang et al. | |
| 11,264,493 | B2 | 3/2022 | Morrow et al. | |
| 11,476,366 | B2 | 10/2022 | Ma et al. | |
| 11,688,637 | B2 | 6/2023 | Mehandru | |
| 12,396,227 | B2 * | 8/2025 | Xie | H10D 30/014 |
| 2021/0399099 | A1 * | 12/2021 | Chu | H10D 30/6729 |
| 2021/0399109 | A1 * | 12/2021 | Su | H10D 30/6737 |
| 2022/0199530 | A1 | 6/2022 | Huang et al. | |
| 2023/0197815 | A1 * | 6/2023 | Huang | H10D 30/014<br>257/288 |
| 2024/0063121 | A1 * | 2/2024 | Xie | H10D 30/43 |
| 2024/0072116 | A1 * | 2/2024 | Xie | H10D 30/014 |
| 2024/0072133 | A1 * | 2/2024 | Xie | H10D 30/014 |
| 2024/0088233 | A1 * | 3/2024 | Roy Chowdhury | H10D 64/01 |
| 2024/0096983 | A1 * | 3/2024 | Xie | H10D 64/256 |
| 2024/0128318 | A1 * | 4/2024 | Xie | H10D 62/121 |
| 2024/0128334 | A1 * | 4/2024 | Xie | H10D 30/6757 |
| 2024/0204100 | A1 * | 6/2024 | Xie | H10D 30/63 |
| 2024/0429283 | A1 * | 12/2024 | Reznicek | H10D 30/6729 |
| 2025/0079309 | A1 * | 3/2025 | Zou | H10W 20/069 |
| 2025/0081541 | A1 * | 3/2025 | Kang | H10D 30/6757 |

* cited by examiner

WRAP AROUND BACKSIDE SOURCE/DRAIN CONTACT

BACKGROUND

The present invention generally relates to fabrication methods and resulting structures for semiconductor devices, and more specifically, to processing methods and resulting structures for providing wrap-around backside source/drain contacts.

The development of an integrated circuit (i.e., chip) involves several stages from design through fabrication. Many aspects of the development are performed iteratively to ensure that the chip ultimately manufactured meets all design requirements. Defining the chip architecture is one of the earliest phases of integrated circuit development. The power (e.g., power requirement), performance (e.g., timing), and area (i.e., space needed) for the resulting chip, collectively PPA, is one of the primary metrics by which integrated circuits are evaluated. PPA is largely a consequence of the chip architecture.

Semiconductor fabrication continues to evolve towards improving one or more aspects of PPA. For example, a higher number of active devices (mainly transistors) of ever decreasing device dimensions are placed on a given surface of semiconductor material. Density scaling has put a strain on the design and fabrication of the interconnects between the front end of line of the integrated circuit, consisting mainly of the active devices, and the contact terminals of the integrated circuit. In many chip architectures, all of these interconnects are incorporated in the back end of line (BEOL) structure of the integrated circuit, which includes a stack of metallization layers and vertical via connections built on top of the front end of line (FEOL) structure.

A key component of the BEOL structure is the power delivery network (PDN). The PDN of an integrated circuit is defined by the conductors and vias connected to the power supply (VDD) and ground (VSS) terminals of the chip. The PDN is responsible for delivering power to the individual devices in the front end. The integration of the PDN in the BEOL has become particularly challenging as device densities continue to scale. Backside power delivery is one known solution to this problem, and involves moving some (or most, or all) layers of the PDN from the front side of the integrated circuit to the back side. In a backside-style architecture, the repositioned layers are not formed on top of the FEOL, but are instead formed on the opposite side of the chip (i.e., on the backside of the semiconductor substrate onto which the active devices have been built).

SUMMARY

Embodiments of the invention are directed to a method for providing wrap-around backside source/drain contacts through a wafer backside. A non-limiting example of the method includes forming a first field effect transistor having a first source or drain (S/D) region, a second S/D region, and a backside contact. The backside contact includes a lower portion and a wrap-around portion wrapping around a lower portion of the second S/D region. The method includes forming a second field effect transistor having a frontside contact on a S/D region and a backside sacrificial region below the S/D region.

Embodiments of the invention are directed to a semiconductor structure. A non-limiting example of the semiconductor structure includes a first field effect transistor and a second filed effect transistor. The first field effect transistor includes a first S/D region, a second S/D region, and a backside contact. The backside contact includes a lower portion and a wrap-around portion wrapping around a lower portion of the second S/D region. The second field effect transistor includes a frontside contact on a S/D region and a backside sacrificial region below the S/D region.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1A:
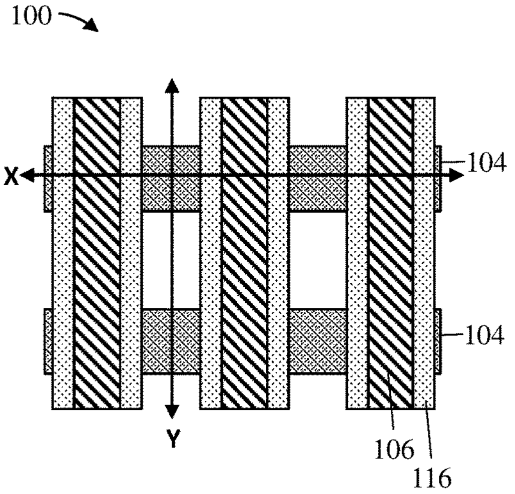
FIG. 1A depicts a top-down view of a semiconductor wafer after an initial set of processing operations according to one or more embodiments.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another. Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

As discussed previously, a key component of the BEOL structure is the power delivery network (PDN). Backside power delivery, also referred to as a backside power delivery network (BSPDN), is a chip architecture that involves repositioning layers of the PDN from the top of the FEOL to the opposite side of the chip to free space on the front side for additional elements (e.g., more transistors). In other words, in a backside-style architecture the PDN layers are placed on the backside of the semiconductor substrate onto which the active devices have been built.

Some challenges remain, however, in effectively placing the various backside power rails and backside contacts (e.g., gate, source, and/or drain contacts) required to provide electrical continuity to the backside devices of these architectures. For example, the placement of a backside source/drain contact is natively restricted by the dielectric gate spacer footing (sometimes referred to as the gate spacer footing, or simply, the footing) that remains in the source/drain area following the gate-spacer breakthrough. This footing is an inadvertent remnant of the FEOL, as the source/drain epitaxy naturally shields the dielectric spacer from being fully removed. The footing reduces the available footprint for the backside source/drain contact and results in a limited interface between the backside source/drain contact and the source/drain epitaxy.

This disclosure introduces new fabrication methods and resulting structures for wrap-around backside source/drain contacts. Rather than landing on the gate spacer footing, aspects of this disclosure instead remove the footing from the wafer backside and leverage the resulting footing trench to trim (also referred to as a sidewall recess) the source/drain epitaxy, ensuring that the backside contact fully wraps around the source/drain epitaxy. The result is a greatly increased interface between the backside source/drain contact and the source/drain epitaxy.

Building wrap-around backside source/drain contacts by leveraging the gate spacer footing in accordance with one or more embodiments described herein offers various technical advantages over prior approaches. Notably, increasing the available interface between the backside source/drain contact and the source/drain epitaxy enables better device performance. Other advantages are possible. In particular, leveraging the dielectric gate spacer footing to trim the source/drain epitaxy means that the FEOL can be freed from any design constraints which where previously restricted due to the resulting footprint of the gate spacer footing. For example, the source/drain epitaxy can be grown to any desired shape without concern for the extent of shielding over the gate spacer nor the size of the final footing.

Figure 1B:
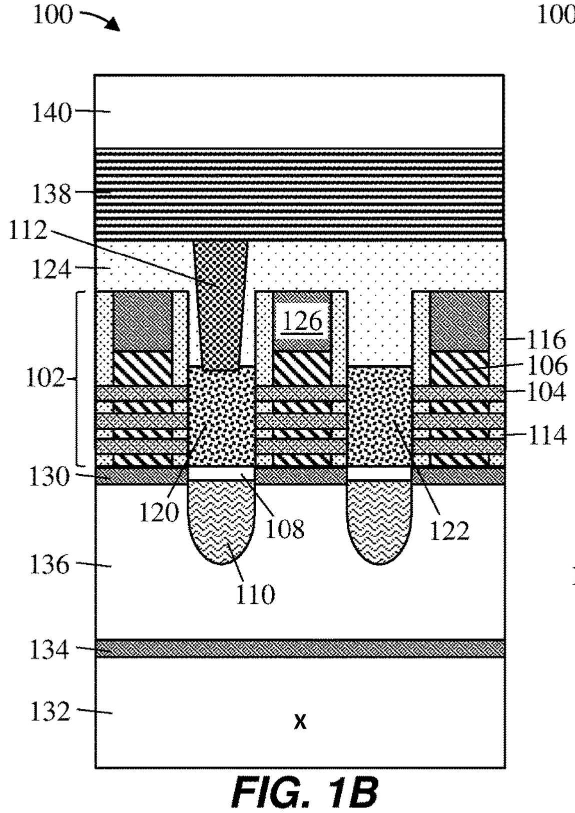
FIG. 1B depicts a cross-sectional view taken along the line X (across gate in channel region) in FIG. 1A after the initial set of processing operations according to one or more embodiments.
Figure 1C:
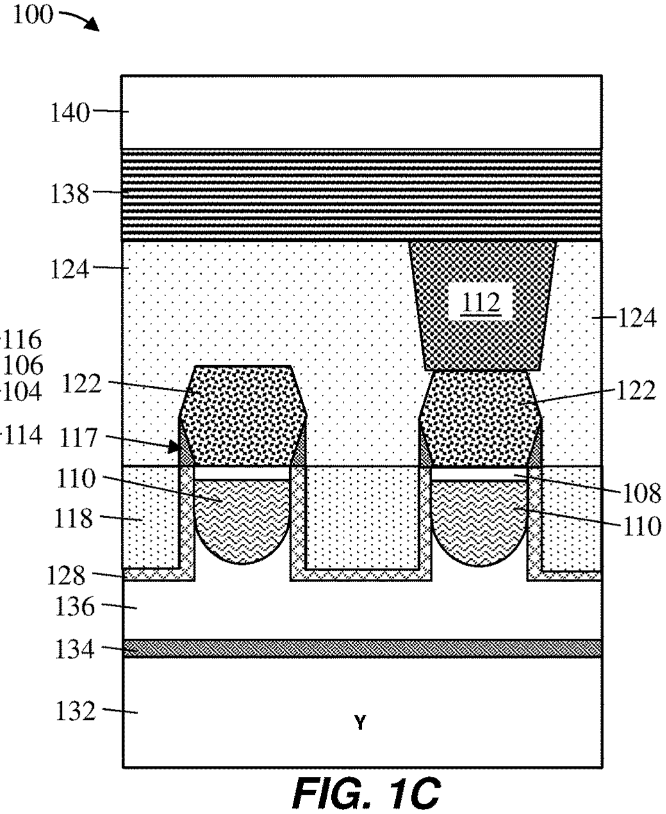
FIG. 1C depicts a cross-sectional view taken along the line Y (across channel in source/drain region) in FIG. 1A after the initial set of processing operations according to one or more embodiments.

Turning now to a more detailed description of fabrication operations and resulting structures according to aspects of the invention, FIG. 1A depicts a top-down reference view of a semiconductor wafer 100 after an initial set of fabrication operations (e.g., through FEOL, MOL, BEOL formation and carrier wafer bonding) have been applied as part of a method of fabricating a final semiconductor device according to one or more embodiments of the invention. FIG. 1B depicts a cross-sectional view taken along the line X (across gate in channel region) in FIG. 1A. FIG. 1C depicts a cross-sectional view taken along the line Y (across channel in source/drain region) in FIG. 1A.

As shown in FIGS. 1A-1C, various FEOL structures 102 have been built in the semiconductor wafer 100. The specific examples of the FEOL structures 102 are illustrative only and are not meant to be particularly limited. For example, the FEOL structures 102 depict a nanosheet-style transistor architecture. It should be understood, however, that the nanosheet-style transistor architecture of the FEOL structures 102 is provided for ease of discussion only and that other transistor architectures (e.g., vertical tunneling transistors, planar transistors, finFETs, etc.) are included in the contemplated scope of this disclosure. Other FEOL structures can be fabricated depending on the needs of a given application, and all such configurations are within the contemplated scope of this disclosure.

In some embodiments, the semiconductor wafer 100 includes one or more nanosheets 104 (collectively, a nanosheet stack(s)) and a gate 106 formed over channel regions of the one or more nanosheets 104. As used herein, a "channel region" refers to the portion of a nanosheet of the one or more nanosheets 104 over which the gate 106 is formed, and through which current passes from source to drain in the final device.

The semiconductor wafer 100 can include various additional FEOL, MOL, and BEOL structures, such as, for example, a bottom semiconductor layer 108, a backside sacrificial region 110 (also referred to as a backside placeholder), frontside contacts 112 (as shown, a frontside source/drain contact), inner spacers 114, gate spacers 116, a gate spacer footing 117, a shallow trench isolation (STI) region 118, first S/D regions 120, second S/D regions 122, and interlayer dielectrics (ILD) 124 (sometimes referred to as a frontside ILD). In some embodiments, semiconductor wafer 100 can include additional structures, such as, for example, a gate cap 126 (also referred to as a self-aligned or SAC cap), an STI liner 128, and a bottom spacer 130, configured and arranged as shown.

In some embodiments, the backside sacrificial region 110 is made of a material selected to have etch selectivity with respect to a later-formed backside interlayer dielectric (backside ILD, refer to FIG. 3B), the STI liner 128, and/or the gate spacer footing 117.

In some embodiments, the semiconductor wafer 100 includes a substrate 132 (e.g., Si) having an etch stop layer 134 (e.g., a buried oxide layer or a SiGe epi layer) and an additional semiconductor layer 136 (e.g., Si) over the etch stop layer 134, although other substrate configurations and materials are within the contemplated scope of this disclosure. In some embodiments, the substrate (e.g., substrate 132/134/136) includes a silicon-on-insulator (SOI) structure and the substrate 132 is a bottommost substrate layer.

In some embodiments, the BEOL structures of the semiconductor wafer 100 can further include an interconnect 138 (which itself can include any number of levels of vias and lines). The BEOL structures shown are merely illustrative and the semiconductor wafer 100 can include any number of BEOL structures (e.g., additional interconnect layers, vias, lines, etc.) and all such configurations are within the contemplated scope of this disclosure.

In some embodiments, a carrier wafer 140 is formed over the BEOL structures (e.g., the interconnect 138). The carrier wafer 140 can be made of a same or different material as the substrate 132/134/136, such as silicon and/or a wafer handling material.

Figure 2A:
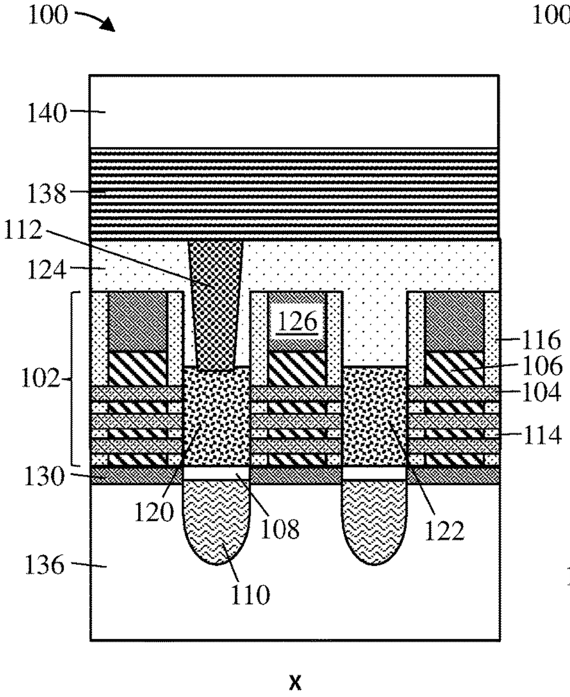
FIG. 2A depicts a cross-sectional view taken along the line X after a processing operation according to one or more embodiments.
Figure 2B:
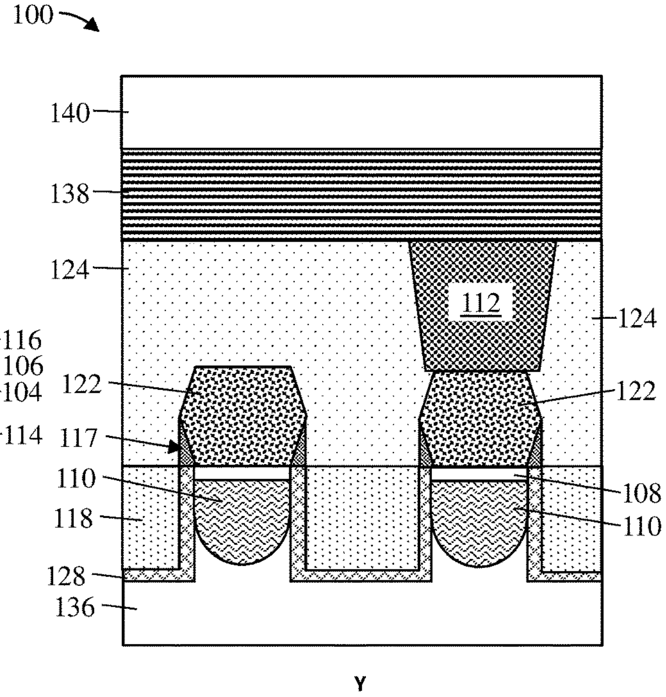
FIG. 2B depicts a cross-sectional view taken along the line Y after the processing operation according to one or more embodiments.

FIGS. 2A and 2B depict cross-sectional views of the semiconductor wafer 100 taken along the lines X and Y, respectively, after a processing operation according to one or more embodiments. As shown in FIGS. 2A and 2B, the substrate 132 and the etch stop layer 134 are removed. In some embodiments, the semiconductor wafer 100 is flipped and the substrate 132 is removed post-wafer flip. In some embodiments, removal of the substrate 132 lands (or stops) on the etch stop layer 134. For example, the substrate 132 can be removed by grinding and/or chemical-mechanical planarization (CMP), followed by dry etch and wet etch processes to remove substrate 132 (e.g., silicon), stopping on the etch stop layer 134. Note that the orientation of the semiconductor wafer 100 shown in FIGS. 2A and 2B remains fixed for ease of discussion. In some embodiments, the etch stop layer 134 is removed after stripping off the substrate 132 to expose portions of the additional semiconductor layer 136.

Figure 3A:
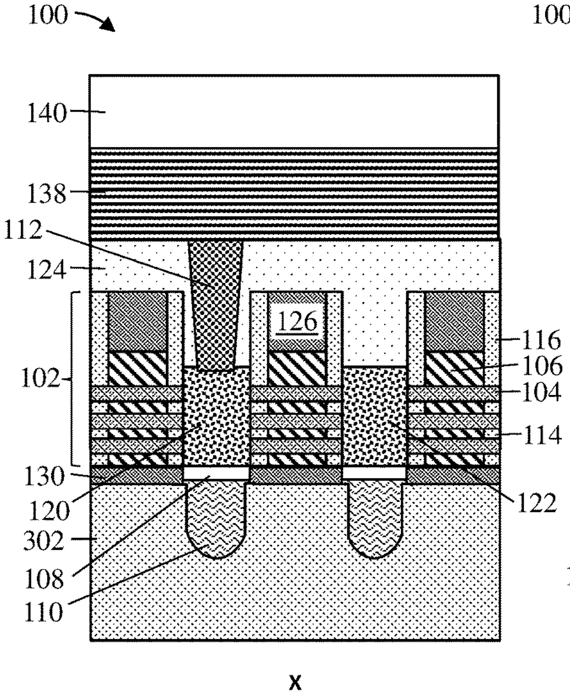
FIG. 3A depicts a cross-sectional view taken along the line X after a processing operation according to one or more embodiments.
Figure 3B:
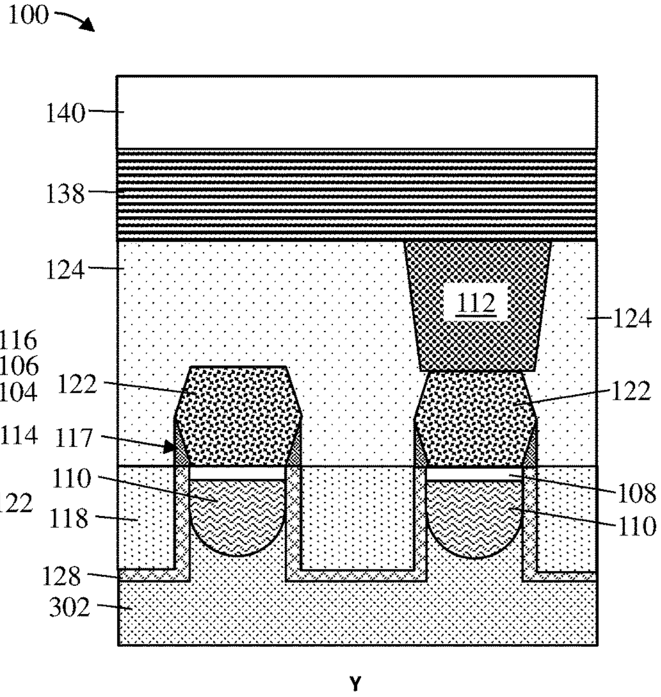
FIG. 3B depicts a cross-sectional view taken along the line Y after the processing operation according to one or more embodiments.

FIGS. 3A and 3B depict cross-sectional views of the semiconductor wafer 100 taken along the lines X and Y, respectively, after a processing operation according to one or more embodiments. As shown in FIGS. 3A and 3B, the exposed portions of the additional semiconductor layer 136 (refer to FIGS. 2A and 2B) are then removed. In some embodiments, portions of the additional semiconductor layer 136 are removed selective to the STI liner 128, the backside sacrificial region 110, and/or the bottom spacer 130. In this manner, the underlying structures (e.g., gate, S/D epi, etc.) can be preserved without risk of inadvertent damage.

In some embodiments, the removed additional semiconductor layer 136 is replaced with a backside interlayer dielectric (BILD) 302. The BILD 302 can be made from any suitable dielectric material, such as, for example, a low-k dielectric, a nitride, silicon nitride, silicon oxide, SiON, SiC, SiOCN, SiBCN, etc. In some embodiments, the BILD 302 is made of a material selected to allow for etch selectivity with respect to the backside sacrificial region 110, the STI liner 128, and/or the gate spacer footing 117.

Figure 4A:
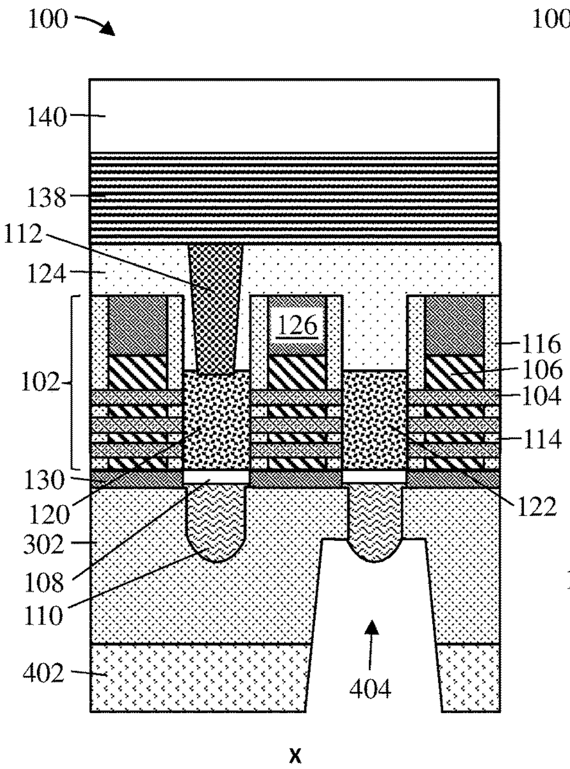
FIG. 4A depicts a cross-sectional view taken along the line X after a processing operation according to one or more embodiments.
Figure 4B:
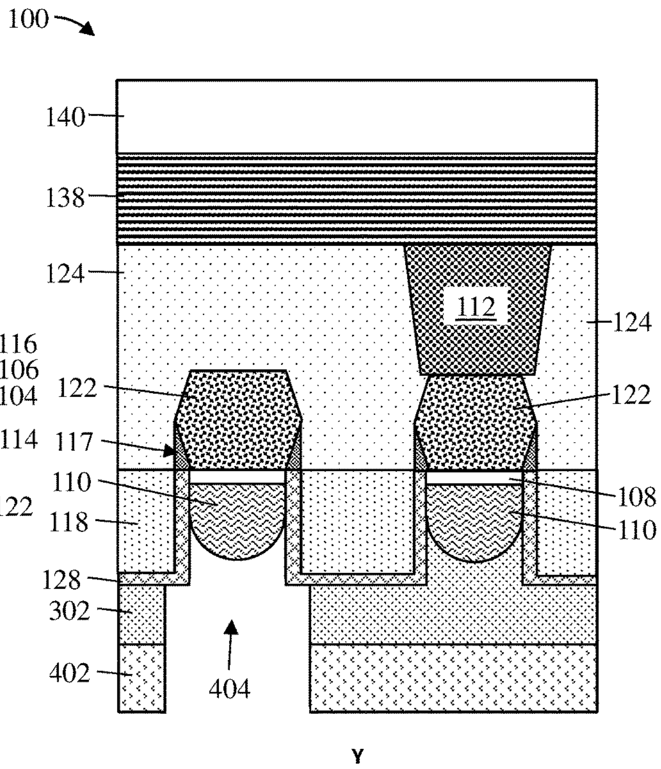
FIG. 4B depicts a cross-sectional view taken along the line Y after the processing operation according to one or more embodiments.

FIGS. 4A and 4B depict cross-sectional views of the semiconductor wafer 100 taken along the lines X and Y, respectively, after a processing operation according to one or more embodiments. As shown in FIGS. 4A and 4B, a patterning film stack can be formed over the semiconductor wafer 100. The patterning film stack can be a bi-layer stack, a tri-layer stack, or a multilayer stack including an organic planarization layer (OPL) 402. The patterning film stack can also include an antireflective coating and a topmost photoresist layer (these additional possible layers not separately shown). Patterning layer stacks typically include OPLs because high resolution photoresists themselves often do not provide enough etch resistance for pattern transfer. OPLs are used as etch masks for pattern transfers into inorganic substrates, to fill pre-existing features, and to planarize the substrate to allow for larger patterning process windows.

The OPL 402 can be formed over a surface of the semiconductor wafer 100 using any suitable process. In some embodiments, the OPL 402 can be applied using, for example, spin coating technology. In some embodiments, the OPL 402 can include a photo-sensitive organic polymer having a light-sensitive material that, when exposed to electromagnetic (EM) radiation, is chemically altered and thus configured to be removed using a developing solvent. For example, the photo-sensitive organic polymer can be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the OPL 402 can include any organic polymer and a photo-active compound having a molecular structure that can attach to the molecular structure of the organic polymer. In some embodiments, the OPL 402 material is selected to be compatible with the overlying antireflective coating (if present), the overlying photoresist (if present), and the lithographic wavelength employed (e.g., ArF, KrF, etc.).

The antireflective coating can be made of any suitable antireflective material, such as, for example, a low temperature oxide (LTO), SiARC, TiARC, or SiON. The antireflective coating can be deposited using, for example, a spin-on process. The photoresist can include any suitable photoresist material, such as, for example, 248 nm resists, 193 nm resists, 157 nm resists, or EUV (extreme ultraviolet) resists. In some embodiments, the photoresist can be made of a light sensitive polymer, and can be deposited using any suitable resist process, such as spin-on coating.

As further depicted in FIGS. 4A and 4B, an OPL open 404 can be formed in the patterning film stack over and to expose portions of the backside sacrificial region 110. This process can be referred to as backside contact patterning. In some embodiments, a photoresist can be patterned (opened) by exposure to a photo-lithography developing solvent to expose a surface of an antireflective coating. The pattern in the photoresist can be transferred to the underlying antireflective coating using a dry etch process. The pattern in the antireflective coating can be transferred to the underlying OPL 402 using, for example, a wet etch, a dry etch, or a combination of wet and/or dry etches.

Figures 5A, 5B:
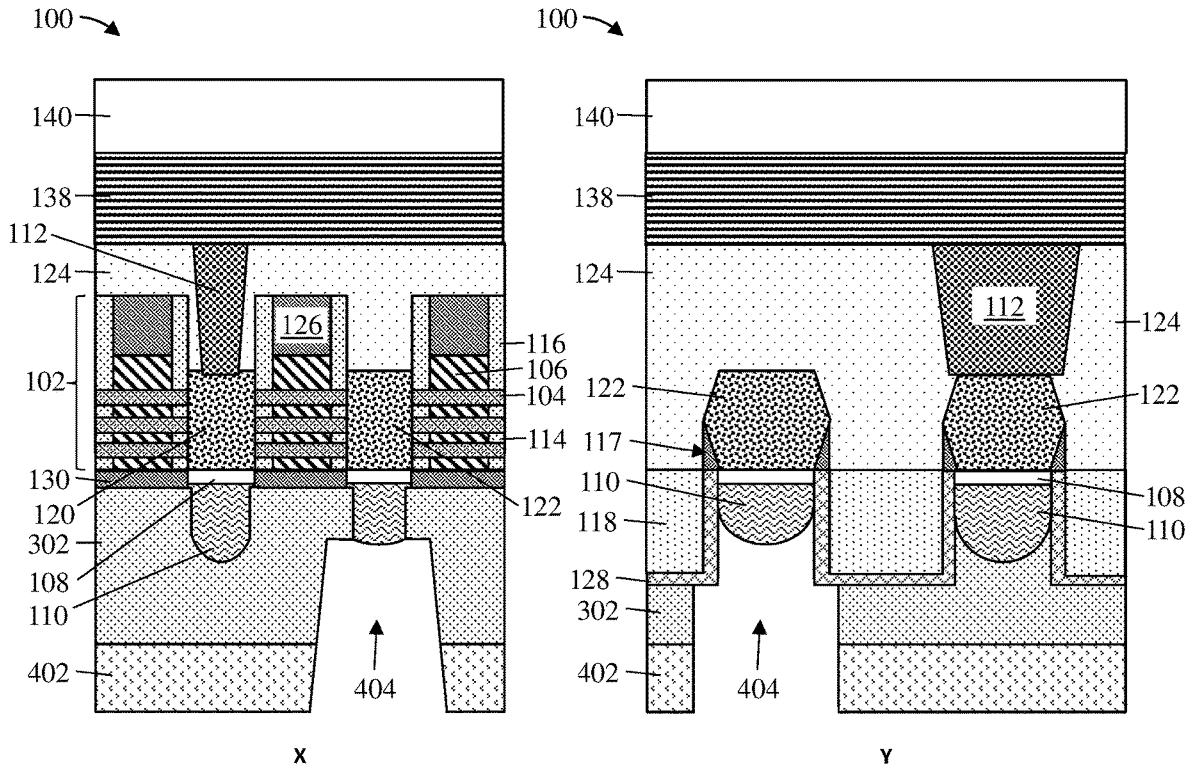
FIG. 5A depicts a cross-sectional view taken along the line X after a processing operation according to one or more embodiments.
FIG. 5B depicts a cross-sectional view taken along the line Y after the processing operation according to one or more embodiments.

FIGS. 5A and 5B depict cross-sectional views of the semiconductor wafer 100 taken along the lines X and Y, respectively, after a processing operation according to one or more embodiments. As shown in FIGS. 5A and 5B, the exposed portions of the backside sacrificial region 110 can be recessed using, for example, a wet etch, a dry etch, or a combination of wet and/or dry etches. This process can be referred to as the backside placeholder recess.

Figure 6A:
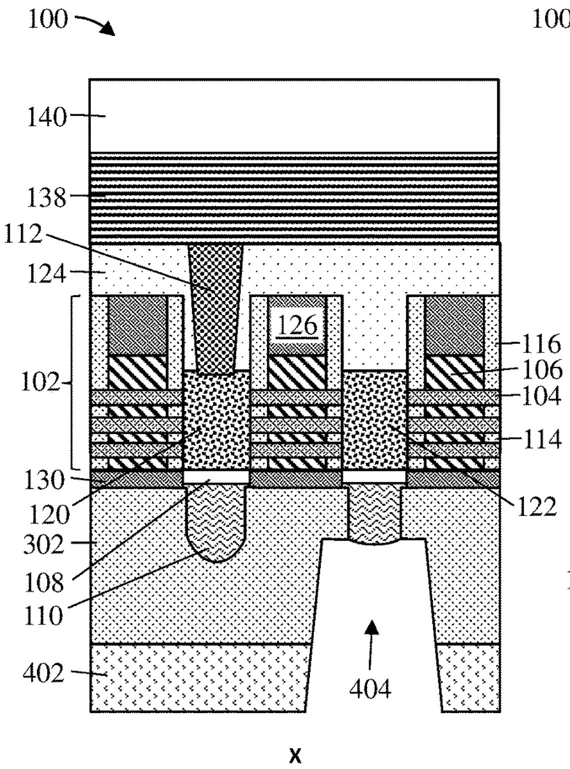
FIG. 6A depicts a cross-sectional view taken along the line X after a processing operation according to one or more embodiments.
Figure 6B:
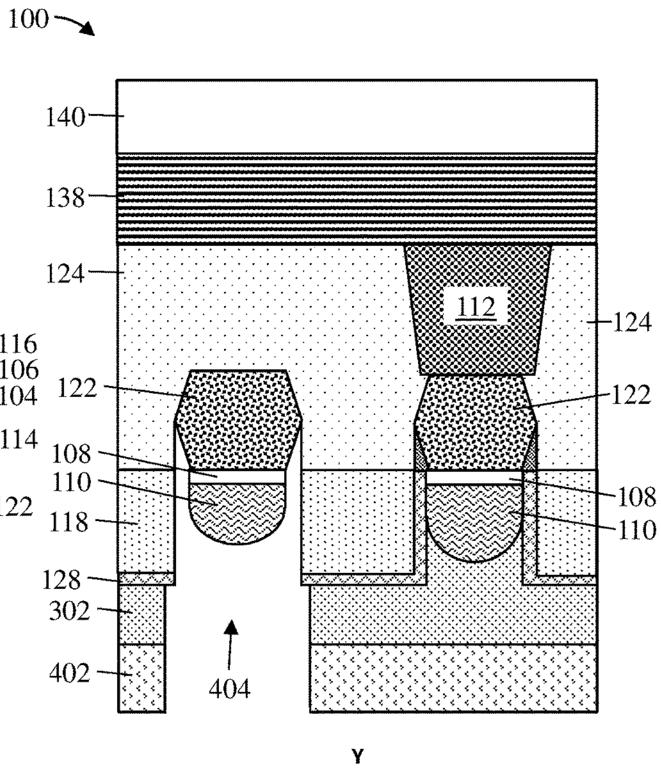
FIG. 6B depicts a cross-sectional view taken along the line Y after the processing operation according to one or more embodiments.

FIGS. 6A and 6B depict cross-sectional views of the semiconductor wafer 100 taken along the lines X and Y, respectively, after a processing operation according to one or more embodiments. As shown in FIGS. 6A and 6B, exposed portions of the STI liner 128 and the gate spacer footing 117 are removed. In some embodiments, the STI liner 128 and the gate spacer footing 117 are removed selective to the STI 118, the BILD 302, and/or the ILD 124. For example, the STI liner 128 and the gate spacer footing 117 can be removed using a RIE selective to the STI 118, the BILD 302, and/or the ILD 124. In some embodiments, etch selectivity between the STI liner 128 (e.g., SiN), the gate spacer footing 117 (e.g. SiN), and BILD (e.g. SiC) will ensure that the BILD 302 will not pull up during this process.

Figure 7A:
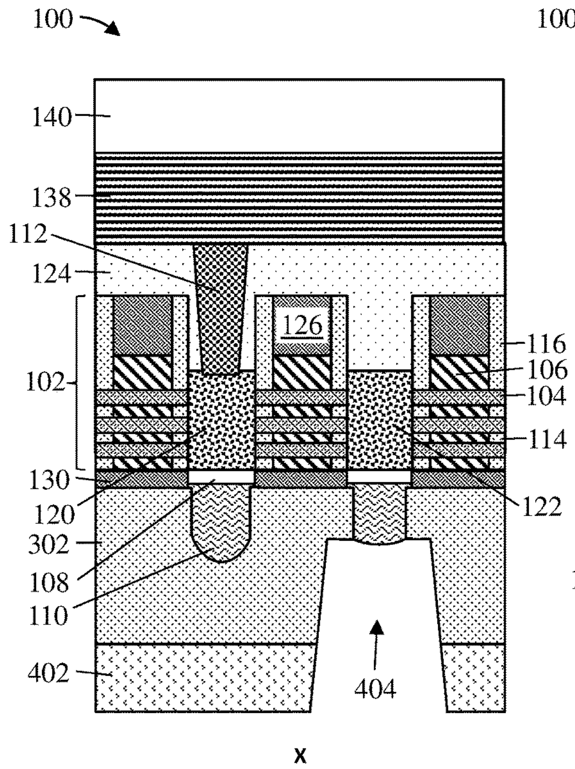
FIG. 7A depicts a cross-sectional view taken along the line X after a processing operation according to one or more embodiments.
Figure 7B:
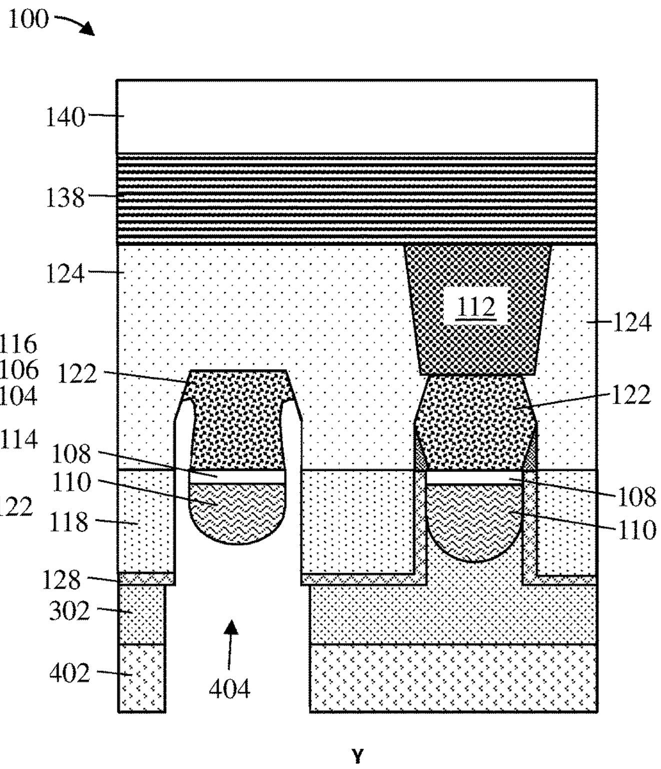
FIG. 7B depicts a cross-sectional view taken along the line Y after the processing operation according to one or more embodiments.

FIGS. 7A and 7B depict cross-sectional views of the semiconductor wafer 100 taken along the lines X and Y, respectively, after a processing operation according to one or more embodiments. As shown in FIGS. 7A and 7B, exposed portions of the second S/D regions 122 are recessed. In some embodiments, the exposed portions (sidewalls) of the second S/D regions 122 can be recessed using, for example, a wet etch, a dry etch, or a combination of wet and/or dry etches. This process can be referred to as the self-aligned source/drain sidewall trim. Observe that, while the self-aligned source/drain sidewall trim is primarily illustrated and discussed with respect to the second S/D regions 122, an equivalent process can be carried out for the first S/D regions 120 instead, or in addition, and all such configurations are within the contemplated scope of this disclosure.

Figure 8A:
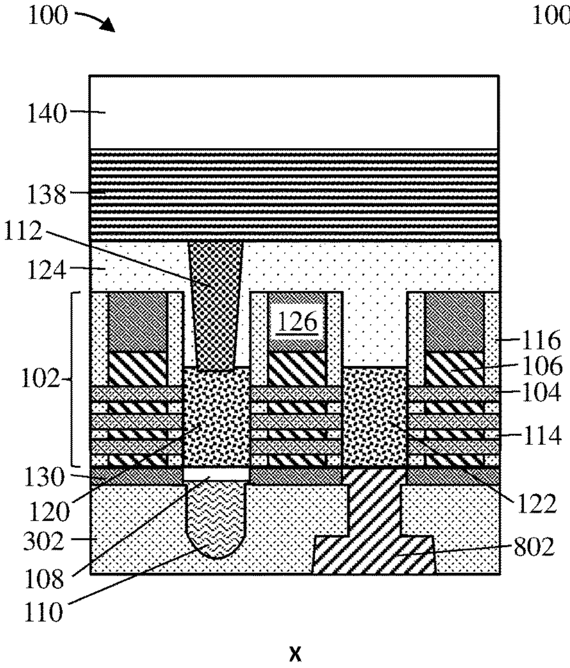
FIG. 8A depicts a cross-sectional view taken along the line X after a processing operation according to one or more embodiments.
Figure 8B:
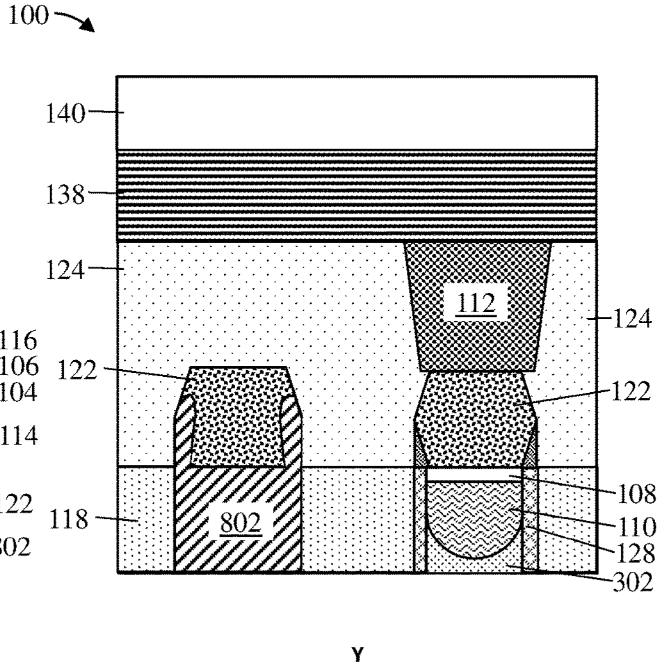
FIG. 8B depicts a cross-sectional view taken along the line Y after the processing operation according to one or more embodiments.

FIGS. 8A and 8B depict cross-sectional views of the semiconductor wafer 100 taken along the lines X and Y, respectively, after a processing operation according to one or more embodiments. As shown in FIGS. 8A and 8B, the bottom semiconductor layer 108 and the backside sacrificial region 110 are removed and the OPL open 404 is filled with conductive material (e.g., metals, doped semiconductors, etc.) to define a backside contact 802 (also referred to as a backside S/D contact). This process can be referred to as the placeholder removal and wrap-around backside S/D contact metallization. Observe that the backside contact 802 wraps around the trimmed (refer to FIG. 7B) sidewalls of the second S/D regions 122 and thus can be referred to as a wrap-around backside source/drain contact.

In some embodiments, the bottom semiconductor layer 108 and the backside sacrificial region 110 are removed selective to the second S/D regions 122, BILD 302, STI liner 128, STI region 118, and/or ILD 124. In some embodiments, the OPL 402 is removed following the removal of the bottom semiconductor layer 108 and the backside sacrificial region 110 and/or after the formation of the backside contact 802.

Figure 9A:
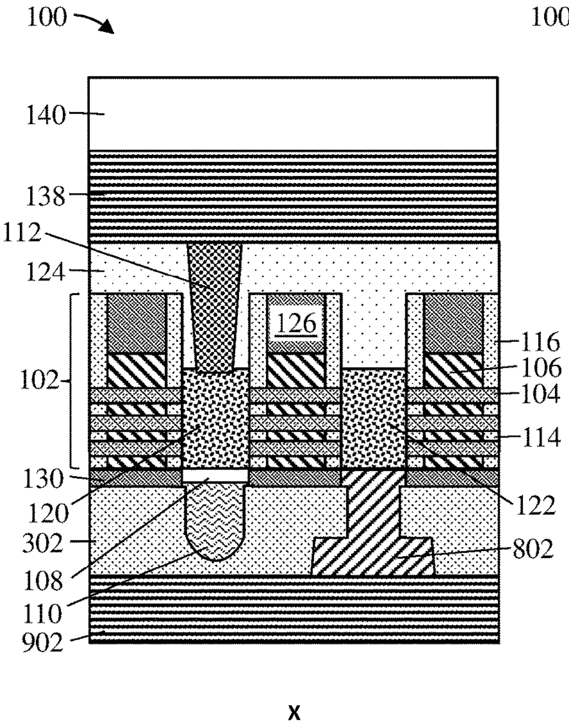
FIG. 9A depicts a cross-sectional view taken along the line X after a processing operation according to one or more embodiments.
Figure 9B:
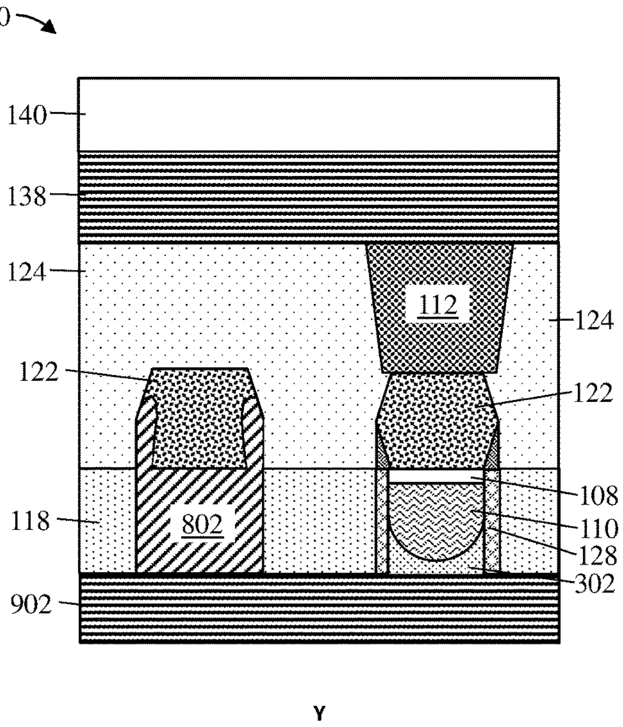
FIG. 9B depicts a cross-sectional view taken along the line Y after the processing operation according to one or more embodiments.

FIGS. 9A and 9B depict cross-sectional views of the semiconductor wafer 100 taken along the lines X and Y, respectively, after a processing operation according to one or more embodiments. As shown in FIGS. 9A and 9B, additional backside processing can include forming a backside power delivery network (BSPDN) 902 over the semiconductor wafer 100. The backside power delivery network 902 can include any number of conductive/metal layers, lines, and vias, and can be formed in a similar manner as the BEOL interconnect structures (e.g., interconnect 138) discussed previously, except that the backside power delivery network 902 is formed on an opposite side of the semiconductor wafer 100. Additional backside layers and dielectrics (omitted for clarity) can be formed before or after the backside power delivery network 902.

After backside processing is complete, the semiconductor wafer 100 can be finalized using known processes (e.g., additional BEOL, far back end of line (FBEOL), and packaging processes used to define a final device, including the incorporation of additional frontside and/or backside metallization layers).

Figure 10:
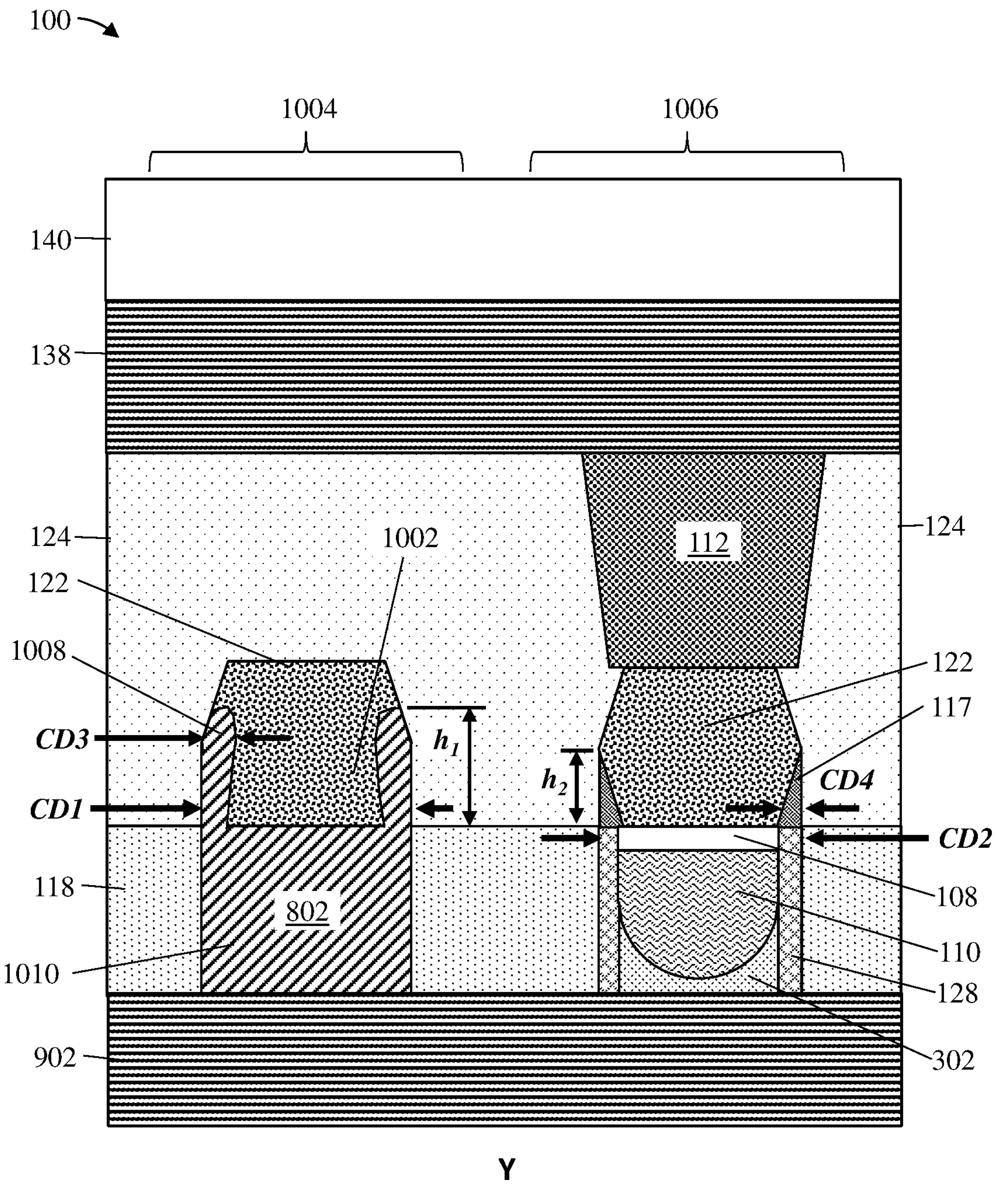
FIG. 10 depicts a cross-sectional view taken along the line Y after the processing operation of FIG. 9B according to one or more embodiments.

FIG. 10 depicts a cross-sectional view of the semiconductor wafer 100 taken along the line Y after the processing operation shown in FIG. 9B. As shown in FIG. 10, the backside contact 802 wraps around a lower portion 1002 (e.g., the trimmed sidewalls) of the second S/D regions 122. Observe that, while the gate spacer footing 117 was removed from a first field effect transistor 1004 (left side FIG. 10), the gate spacer footing 117 remains in other FETs (e.g., a second field effect transistor 1006). While the remaining portions of the gate spacer footing 117 do not impact device performance (those FETs rely on frontside contacts), they can serve as a sort of physical signature of the process for providing wrap-around backside source/drain contacts as described herein. As further signature, a backside sacrificial region 110 (a placeholder) remains under the second S/D regions 122 in the second field effect transistor 1006, the second S/D regions 122 are connected to the BEOL (e.g., the interconnect 138) through a MOL contact (e.g., frontside contacts 112), and the STI liner 128 is under the backside sacrificial region 110 and between the BILD 302 and the STI region 118 (the STI oxide).

In some embodiments, the backside contact 802 of the first field effect transistor 1004 has a widest critical dimension (here, "CD1") at the interface between the STI region 118 and the ILD 124 that is the same, or substantially the same within tooling limits, as a combined width (here, "CD2") of the STI liner 128 and the backside sacrificial region 110 of the second field effect transistor 1006.

In some embodiments, the second S/D regions 122 of the first field effect transistor 1004 is trimmed and a wrap-around portion 1008 of the backside contact 802 has a wrap-around critical dimension (here, "CD3") that is the same, or substantially the same within tooling limits, as a widest, bottom portion width (here, "CD4") of the gate spacer footing 117 in the second field effect transistor 1006.

Observe that the second S/D regions 122 of the second field effect transistor 1006 is not trimmed, and that the outer edge-to-edge distance between the STI liner 128 in the second field effect transistor 1006 matches the width of the lower portion 1010 of the backside contact 802 in the first field effect transistor 1004 (that is, they have the same thickness/width profile).

Figure 11:
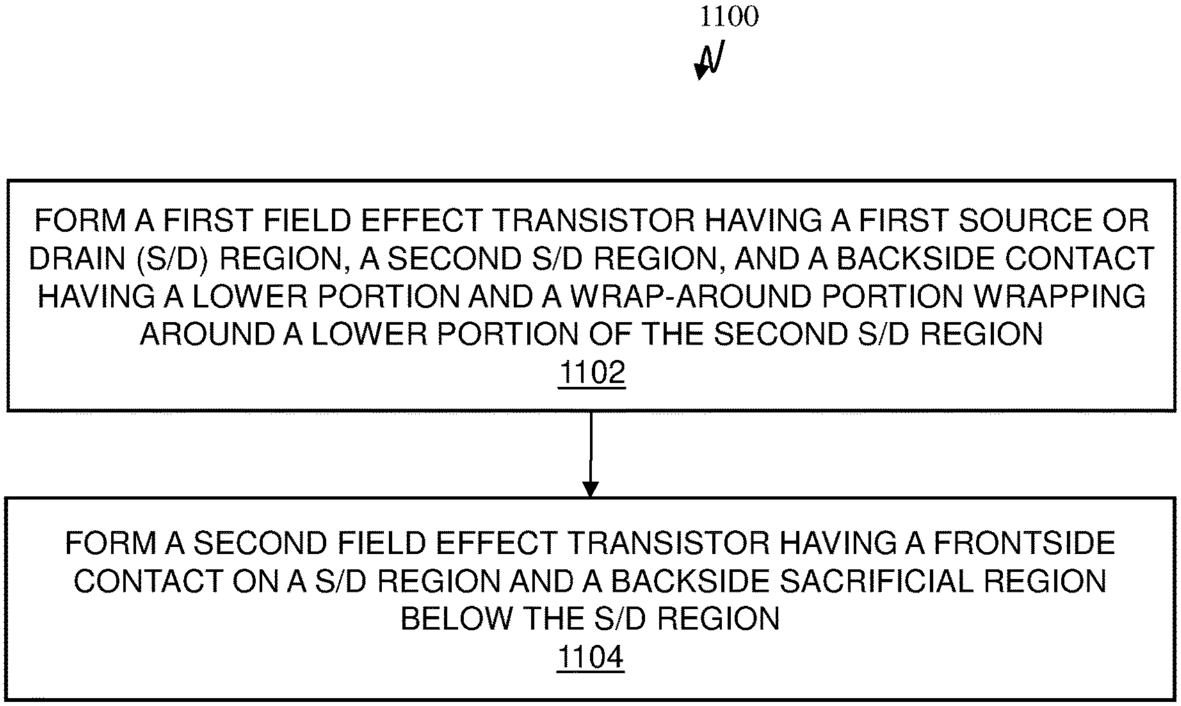
FIG. 11 depicts a flow diagram illustrating a method according to one or more embodiments.

FIG. 11 depicts a flow diagram illustrating a method 1100 for providing wrap-around backside source/drain contacts according to one or more embodiments of the invention. The method 1100 is described in reference to FIGS. 1A-10 and may include additional blocks not depicted in FIG. 11. Although depicted in a particular order, the blocks depicted in FIG. 11 can be rearranged, subdivided, and/or combined.

As shown at block 1102, the method includes forming a first field effect transistor having a first S/D region, a second S/D region, and a backside contact. In some embodiments, the backside contact includes a lower portion and a wrap-around portion wrapping around a lower portion of the second S/D region.

At block 1104, the method includes forming a second field effect transistor having a frontside contact on a S/D region and a backside sacrificial region below the S/D region.

In some embodiments, the backside sacrificial region below the S/D region in the second field effect transistor is between opposite sidewalls of a shallow trench isolation (STI) liner.

In some embodiments, the method includes forming a backside interlayer dielectric (BILD) below the backside sacrificial region and between the opposite sidewalls of the STI liner in the second field effect transistor.

In some embodiments, the method includes forming an STI region positioned below a frontside interlayer dielectric. In some embodiments, a width of the backside contact of the first field effect transistor at an interface between the STI region and the frontside interlayer dielectric is equal to a combined width of the STI liner and the backside sacrificial region of the second field effect transistor.

In some embodiments, the method includes forming a gate spacer footing between the S/D region and the STI liner in the second field effect transistor. In some embodiments, a width of the wrap-around portion of the backside contact of the first field effect transistor is equal to a bottom width of the gate spacer footing of the second field effect transistor. In some embodiments, a height (e.g., "$h_1$" in FIG. 10) of the wrap-around portion of the backside contact of the first field effect transistor is greater than a height (e.g., "$h_2$" in FIG. 10) of the gate spacer footing of the second field effect transistor. The difference in height between h1 and h2 serves as a physical signature of the epitaxy trimming step described with respect to FIG. 7B. Advantageously, the increased height h1 results in a larger backside contact area, improving device performance.

In some embodiments, the method includes forming a bottom semiconductor layer between the S/D region and the backside sacrificial region in the second field effect transistor.

In some embodiments, the method includes forming a backside sacrificial region below the first S/D region and below the second S/D region in the first field effect transistor. In some embodiments, the method includes flipping the semiconductor device and exposing the backside sacrificial region in the first field effect transistor. In some embodiments, the method includes exposing sidewalls of the second S/D region. In some embodiments, the method includes recessing the exposed sidewalls of the second S/D region.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of +8% or 5%, or 2% of a given value.

The phrase "selective to," such as, for example, "a first element selective to a second element," means that the first element can be etched and the second element can act as an etch stop (i.e., the second element remains).

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the invention of the invention, epitaxial growth and/or deposition processes can be selective to forming on semiconductor surface, and may or may not deposit material on other exposed surfaces, such as silicon dioxide or silicon nitride surfaces.

As used herein, "p-type" refers to the addition of impurities to an intrinsic semiconductor that creates deficiencies of valence electrons. In a silicon-containing substrate, examples of p-type dopants, i.e., impurities, include but are not limited to, boron, aluminum, gallium, and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:

forming a first field effect transistor comprising a first source or drain (S/D) region, a second S/D region, and a backside contact, the backside contact comprising a lower portion and a wrap-around portion wrapping around a lower portion of the second S/D region; and forming a second field effect transistor comprising a frontside contact on a S/D region and a backside sacrificial region below the S/D region;

wherein the backside sacrificial region below the S/D region in the second field effect transistor is between opposite sidewalls of a shallow trench isolation (STI) liner.

2. The method of claim 1, further comprising forming a backside interlayer dielectric (BILD) below the backside sacrificial region and between the opposite sidewalls of the STI liner in the second field effect transistor.

3. The method of claim 1, further comprising forming an STI region positioned below a frontside interlayer dielectric.

4. The method of claim 3, wherein a width of the backside contact of the first field effect transistor at an interface between the STI region and the frontside interlayer dielectric is equal to a combined width of the STI liner and the backside sacrificial region of the second field effect transistor.

5. The method of claim 4, further comprising forming a gate spacer footing between the S/D region and the STI liner in the second field effect transistor.

6. The method of claim 5, wherein a width of the wrap-around portion of the backside contact of the first field effect transistor is equal to a bottom width of the gate spacer footing of the second field effect transistor.

7. The method of claim 5, wherein a height of the wrap-around portion of the backside contact of the first field effect transistor is greater than a height of the gate spacer footing of the second field effect transistor.

8. The method of claim 4, further comprising forming a bottom semiconductor layer between the S/D region and the backside sacrificial region in the second field effect transistor.

9. The method of claim 1, further comprising forming a backside sacrificial region below the first S/D region and below the second S/D region in the first field effect transistor.

10. The method of claim 9, further comprising flipping the semiconductor device and exposing the backside sacrificial region in the first field effect transistor.

11. The method of claim 10, further comprising:

exposing sidewalls of the second S/D region; and recessing the exposed sidewalls of the second S/D region.

12. A semiconductor device comprising:

a first field effect transistor comprising a first source or drain (S/D) region, a second S/D region, and a backside contact, the backside contact comprising a lower portion and a wrap-around portion wrapping around a lower portion of the second S/D region; and a second field effect transistor comprising a frontside contact on a S/D region and a backside sacrificial region below the S/D region;

wherein the backside sacrificial region below the S/D region in the second field effect transistor is between opposite sidewalls of a shallow trench isolation (STI) liner.

13. The semiconductor device of claim 12, further comprising a backside interlayer dielectric (BILD) below the backside sacrificial region and between the opposite sidewalls of the STI liner in the second field effect transistor.

14. The semiconductor device of claim 12, further comprising an STI region positioned below a frontside interlayer dielectric.

15. The semiconductor device of claim 14, wherein a width of the backside contact of the first field effect transistor at an interface between the STI region and the frontside interlayer dielectric is equal to a combined width of the STI liner and the backside sacrificial region of the second field effect transistor.

16. The semiconductor device of claim 15, further comprising a gate spacer footing between the S/D region and the STI liner in the second field effect transistor.

17. The semiconductor device of claim 16, wherein a width of the wrap-around portion of the backside contact of the first field effect transistor is equal to a bottom width of the gate spacer footing of the second field effect transistor.

18. The semiconductor device of claim 16, wherein a height of the wrap-around portion of the backside contact of the first field effect transistor is greater than a height of the gate spacer footing of the second field effect transistor.

* * * * *